United States Patent [19]

Tseng

[11] Patent Number: 5,192,702
[45] Date of Patent: Mar. 9, 1993

[54] SELF-ALIGNED CYLINDRICAL STACKED CAPACITOR DRAM CELL

[75] Inventor: Horng-Huei Tseng, Hsinchu, Taiwan

[73] Assignee: Industrial Technology Research Institute, Hsincho, Taiwan

[21] Appl. No.: 811,991

[22] Filed: Dec. 23, 1991

[51] Int. Cl.⁵ .................... H01L 91/265; H01L 21/70
[52] U.S. Cl. ........................................ 437/47; 437/52; 437/228
[58] Field of Search ................... 437/48, 52, 228, 191, 437/47; 156/653, 657; 365/149; 357/23.6, 51

[56] References Cited

U.S. PATENT DOCUMENTS

| 4,742,018 | 5/1988 | Kimura et al. | 437/48 |
| 4,977,102 | 12/1990 | Ema | 437/52 |
| 5,025,295 | 6/1991 | Kuesters et al. | 357/23.6 |
| 5,077,688 | 12/1991 | Kumanoya et al. | 365/149 |
| 5,084,405 | 1/1992 | Fazan et al. | 437/52 |

FOREIGN PATENT DOCUMENTS

| 0404553 | 12/1990 | European Pat. Off. | 437/52 |
| 3918924 | 12/1989 | Fed. Rep. of Germany | 365/149 |
| 2-222467 | 9/1990 | Japan | 437/52 |
| 2-260454 | 10/1990 | Japan | 437/52 |
| 3-180062 | 8/1991 | Japan | 437/52 |
| 3-214767 | 9/1991 | Japan | 437/52 |

OTHER PUBLICATIONS

Mamoka "Are you Ready for Next-Generation Dynamic Random Chips?", IEEE Spectrum, Nov. 1990, pp. 109–112.

Primary Examiner—Olik Chaudhuri
Assistant Examiner—Loc Q. Trinh
Attorney, Agent, or Firm—George O. Saile

[57] ABSTRACT

A method for fabricating a dynamic random access memory having a high capacitance stacked capacitor begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and the device areas. Portions of the first polysilicon layer is removed while leaving portions thereof for the gate structure in the device areas, and portions over the field oxide areas. A first insulator layer composed at least in part of silicon nitride is formed over the device and field oxide areas. The stacked capacitors are now formed by first depositing a second polysilicon layer over the device and field oxide areas. An etch mask is now formed on the second polysilicon layer and the second polysilicon layer is anisotropically etching to form a shell-shaped second polysilicaon layer. A capacitor dielectric layer is formed over the shell-shaped second polysilicon layer. A third polysilicon layer is deposited and patterned as the top storage node electrode to complete the stacked capacitors. The etch mask can either be formed in part by a lateral etching of a resist mask or is formed in part by use of a sidewall spacer structure and mask. The first insulator layer is patterned to expose the source/drain structures to electrical contact either before or after the deposition of the second polysilicon layer.

23 Claims, 17 Drawing Sheets

SELF-ALIGNED CYLINDRICAL STACKED CAPACITOR DRAM CELL

BACKGROUND OF THE INVENTION (1) Field of the Invention

The present invention relates to methods of fabricating a dynamic random access memory having a high capacitance stacked capacitor.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability. In order to achieve the desired higher level of integration, it requires the technology to keep almost the same storage capacitance on a greatly reduced cell area.

Efforts to maintain or increase the storage capacitance in memory cells with greater packing densities are evident in S. Kimura et al U.S. Pat. No. 4,742,018 and T. Ema U.S. Pat. No. 4,977,102, which disclose stacked capacitors. The publication "Are you ready for next-generation dynamic RAM chips?" by F. Masuoka pages 109-112, IEEE Spectrum, November 1990, describes the problems and possible capacitor structures for future generations of dynamic RAMs. Another approach to achieve sufficient capacitance in high density memories is the use of a stacked trench capacitor cell as described in copending U.S. Patent Application of Wen Doe Su entitled "FABRICATION OF MEMORY CELL WITH AN IMPROVED CAPACITOR" U.S. Pat. No. 5,156,993.

It is well known that in the art of integrated circuit device manufacture, one of the primary goals is increasing the number of device that can be placed into a given unit space on the semiconductor chip. As the traditional fabrication process begin to approach the limit of reduction, considerable attention has been applied to forming device elements on over and above the wafer to take advantage of extra versatility of third dimension.

One of the successful vertically oriented integrated circuit devices is the stacked capacitor. Briefly, a stacked capacitor is formed by forming the stacked capacitor structures laying over the gate electrode on active and field oxide regions and diffusion region. The processing of such structures have become very complicated and require lithography and etching steps which are not in step with the very small dimensions required in the present and future state of the art. Although there has been much work done in accomplishing these small size devices and increased capacitance therein, there is still great need for devices with even greater capacitance for a given space in order to achieve even greater packing densities, and improve the DRAM products of the future.

SUMMARY OF THE INVENTION

Accordingly, it is a primary object of the invention to provide a process for producing a memory cell with a greater capacitance per unit area.

A method is described for fabricating a dynamic random access memory having a high capacitance stacked capacitor. The method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and the device areas. Portions of the first polysilicon layer is removed while leaving portions thereof for the gate structure in the device areas, and portions over the field oxide areas. Source/drain structures are formed within the device areas of said semiconductor substrate associated with the gate structures. A first insulator layer composed at least in part of silicon nitride is formed over the device and field oxide areas. The stacked capacitors are now formed by first depositing a second polysilicon layer over the device and field oxide areas. An etch mask is now formed on the second polysilicon layer and the second polysilicon layer is anisotropically etching to a certain depth to form a shell-shaped second polysilicon layer. A capacitor dielectric layer is formed over the shell-shaped second polysilicon layer. A third polysilicon layer is deposited and patterned as the top storage node electrode to complete the stacked capacitors.

The etch mask can either be formed in part by a lateral etching of a resist mask or is formed in part by use of a sidewall spacer structure and mask. The said first insulator layer is patterned to expose the source/drain structures to electrical contact either before or after the deposition of the second polysilicon layer.

DESCRIPTION OF THE PREFERRED EMBODIMENTS

Figure 1:
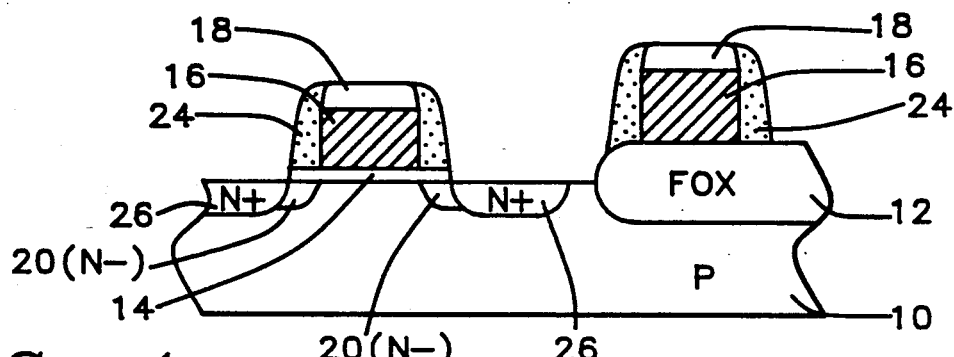
FIGS. 1 through 9 is a schematic cross-sectional representation of a first embodiment method for fabricating a stacked capacitor in combination with a field effect device which is usable in a DRAM cell.

Referring now more particularly to FIGS. 1 through 9 there is shown a first embodiment of the method for fabricating a self-aligned, cylindrical stacked capacitor and field effect device structure. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or field oxide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 80 to 200 Angstroms. The polysilicon layer 16 is blanket deposited by LPCVD (Low Pressure Chemical Vapor Deposition) method. The preferred thickness of the first polysilicon layer 16 is between about 1500 to 4000 Angstroms. The polysilicon layer 16 is ion implanted with phosphorous or arsenic ions under the conditions $5 \times 10^{15}$ to $10 \times 10^{15}$ dosage per area and 20 to 60 Kev. or doped with phosphorus oxychloride at a temperature about 900° C. A surface silicon oxide or glass layer 18 is formed on the polysilicon layer 16. The layers 14, 16 and 18 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices. The stacked capacitor is composed of a lower electrode or storage node, the capacitor dielectric and the upper electrode or plate.

FIG. 1, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 20 is done with, for example phosphorous P31 at a dose of between about $1 \times 10^{13}$ to $10 \times 10^{13}$ atoms/cm$^2$ and with an energy of between about 20 to 40 Kev.

The dielectric spacer 24 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 24 is between about 2000 to 5000 Angstroms and preferably about 2500 Angstroms.

An anisotropic etching of this layer produces the dielectric spacer layer 24 on the sidewalls of the layer structures 14, 16, 18. The preferred anisotropic etching uses a conventional reactive ion etching ambient.

A thin silicon oxide, silicon nitride or the like masking layer (not shown) is usually formed upon the layer structure regions 14, 16, 18, the spacers 24 and the exposed monocrystalline silicon substrate regions to protect the surfaces from ion implantation damage. The conditions for forming this layer are LPCVD deposition of TEOS or LPCVD silicon nitride deposition at about 600° to 900° C. The preferred thickness of this oxide layer is between about 200 to 1000 Angstroms and a preferred thickness of about 600 Angstroms.

The N+ source/drain ion implantation uses Arsenic, As75 with a dose of between about $2 \times 10^{15}$ to $1 \times 10^{16}$ atoms/cm$^2$ and energy of between about 20 to 70 Kev. to complete the source/drain regions 26 of the N channel lightly doped drain MOS FET integrated circuits device as seen in the FIG. 1.

Figure 2:
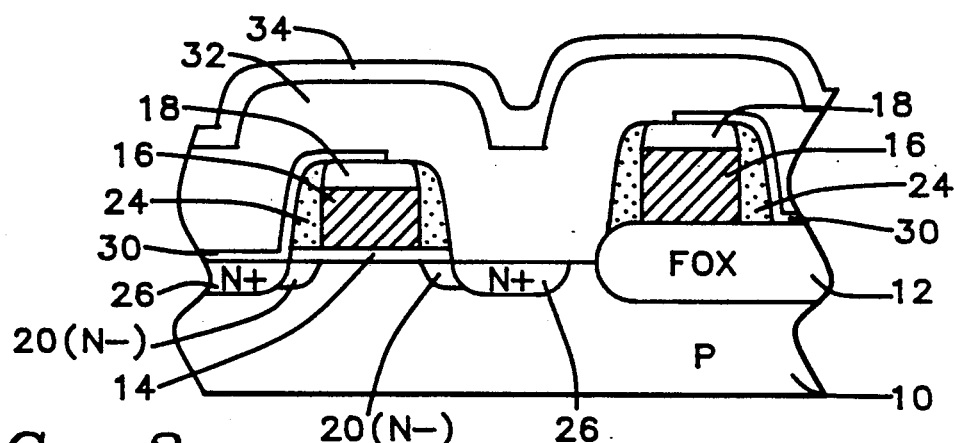

Referring now to FIG. 2, a first insulator layer 30 is formed over the field oxide and device areas. This layer is composed at least in part of silicon nitride for future etch stop needs. The layer 30 is typically composed of a layer of silicon oxide and a layer of silicon nitride. Alternatively, the layer 30 can be composed of layers of silicon oxide, silicon nitride and silicon oxide. The silicon oxide layers are formed by low pressure chemical vapor deposition (LPCVD) with reaction temperature of 720° C., reaction gas of $Si(CH_3)_4$, $N_2O$ and Oxygen, and a pressure of 200 to 300 mTorr. LPCVD is also used for the silicon nitride layer with a reaction temperature of 760° C., reaction gas of $SiH_2Cl_2$ and ammonia, and pressure of 350 mTorr. The overall thickness of the layer 30 is between about 900 to 2000 Angstroms with the individual layer thickness being silicon oxide range of between about 500 to 1000 Angstroms, silicon nitride of between about 200 to 500 Angstroms and silicon oxide of between about 200 to 500 Angstroms. The layer 30 is patterned using conventional lithography and etching techniques to open the source/drain structures in the device areas desired to be electrically and self-aligned contacted as seen in FIG. 2.

A second layer of polysilicon 32 is deposited over the device and field oxide areas. The preferred deposition process is in-situ phosphorus doped wherein the temperature is 570° C., the gas is the mixed gas of (15% $PH_3$ and 85% silane) and (5% $PH_3$ and 95% nitrogen). The mixed gas 5% $PH_3$ and 95% nitrogen plays the role of fine-tuning of the dopant concentration between wafers. Alternatively the layer 32 could be a combination of in-situ doped polysilicon and undoped polysilicon with the former beneath. The undoped polysilicon is formed by LPCVD, the reaction gas is silane, the temperature is 620° C., and pressure is 300 mTorr. The thickness of this layer is between about 3000 to 6000 Angstroms. This layer 32 is a self-aligned contact and lower electrode of the stacked capacitor under construction to the certain of source/drain structures 26.

A second insulator layer 34 which is composed at least in part of silicon nitride is deposited over the second polysilicon layer 32 by LPCVD with a gas of $SiH_2Cl_2$ and ammonia, temperature of 760° C. and pressure of 350 mTorr. The layer 34 is silicon nitride having a thickness of between about 200 to 500 Angstroms.

Figure 3:
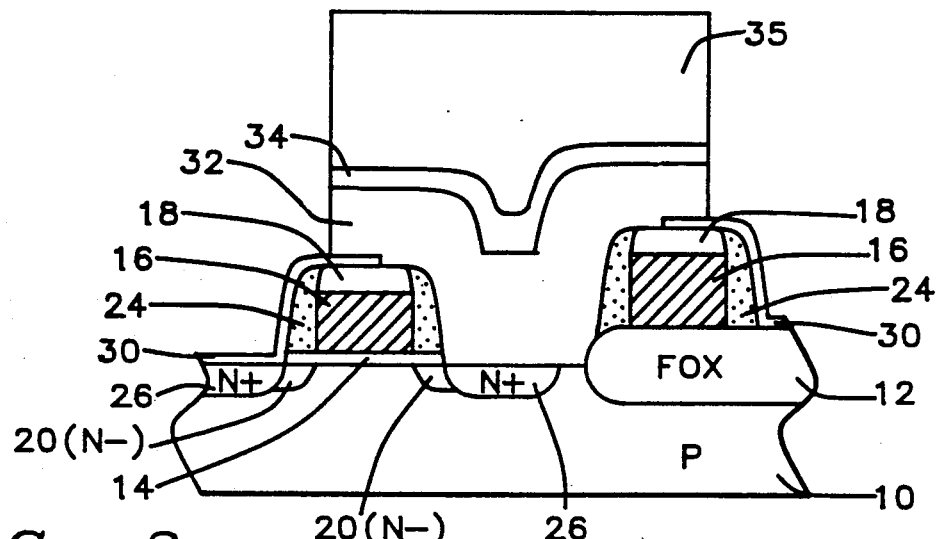

A conventional lithography and etching mask 35 is formed over the second insulator layer 34 and the layers 32 and 34 are anisotropically etched in its exposed areas to define the stacked capacitor areas as seen in FIG. 3.

Figure 4:
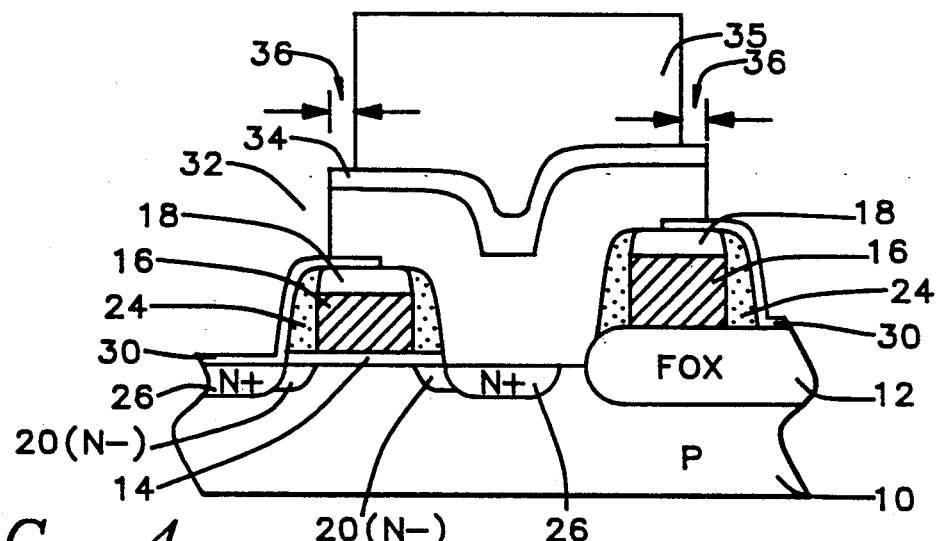

The etch mask 35 is controlably etched to laterally remove a certain portion of the mask and to thereby expose the second portion 36 of insulator layer 34 as seen in FIG. 4. This is a critical step, since it will define the thickness of the cylindrical or shell-shaped portions of the stacked capacitor. The etching of etch mask 35 is preferably by a oxygen plasma process and can be achieved using reactive ion etching (RIE) or magnetic enhance reactive ion etching (MERIE). One suitable piece of equipment is "AME-8110" manufactured by Applied Materials Corp. Using this equipment, the lateral etching of photoresist mask 35 is done using a power of 800 watts, pressure of 50 mTorr. and oxygen flow of 50 sccm. Under these conditions the lateral etching rate is 300 Angstroms per minute. The lateral removal 36 of the etch mask is between about 1000 to 4000 Angstroms to expose the second insulator layer 34 as seen in FIG. 4. It is critical to have at least a thickness of silicon nitride layer 34 of 200 Angstroms because layer 34 serves as the oxidation mask in the subsequent process and a less than about 800 Angstroms because of the low etch rate selectivity of layer 34 to the top silicon oxide portion.

The exposed layer 34 from the etch mask 35 is now removed using anisotropic plasma etching using gases including argon, $CF_4$, $CHF_3$ and oxygen in the RIE or MERIE equipment to produce the FIG. 4 structure. The etch mask 35 is now removed.

The exposed second polysilicon layer is thermally oxidized in an wet oxygen atmosphere at about 900° C. to form silicon oxide layer 38 on the polysilicon layer's exposed surfaces. The second insulator layer 34 is now removed by wet etching with hot phosphoric acid solution at a temperature of about 160° to 180° C.

Figure 5:
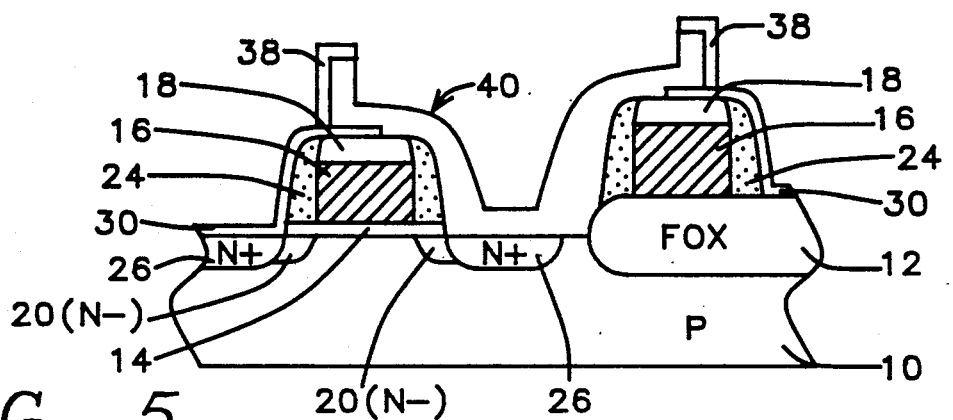

Using the thermal silicon oxide layer 38 as a etch mask, the exposed second polysilicon layer 32 is anisotropically etched through a portion of its thickness as indicated at 40. The RIE or MERIE equipment is used. For example, where the PR5000E MERIE equipment manufactured by Applied Materials Co. is used to perform this anisotropic polysilicon etching process, the process conditions are power of 50 to 150 watts; pressure of 50 mTorr.; magnetic field of 30 gauss; gas flow of HBr at 25 to 45 sccm., chlorine at 25 to 45 sccm., and helium/oxygen at 6 to 10 sccm.; will result in an etch rate of about 1000 Angstroms per minute. The etching process continues until between about 2000 to 4000 Angstroms have been removed and leaving between about 1000 to 2000 Angstroms remaining. The cylindrical or shell-shaped lower electrode is now completed as seen in FIG. 5. The silicon oxide layer 38 is removed using a conventional HF silicon oxide etchant.

Figure 6:
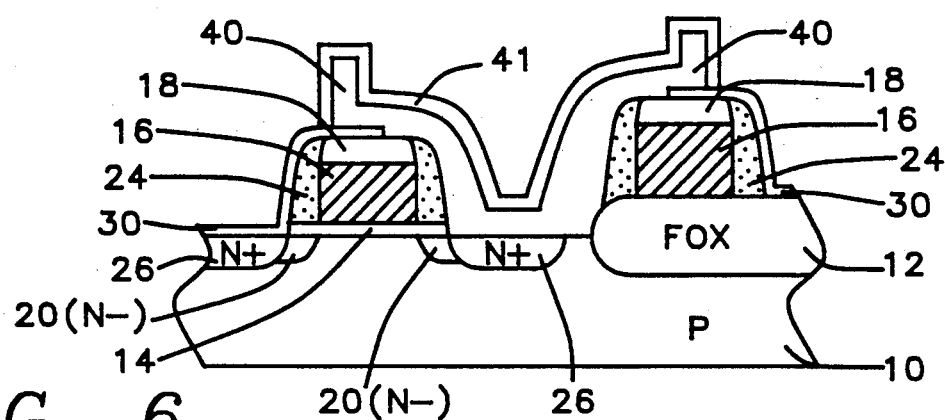
Figure 7:
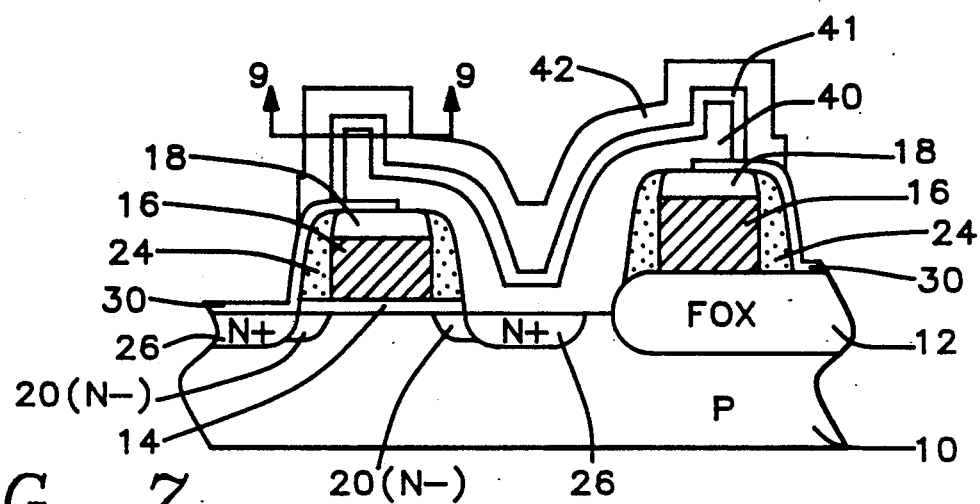

The capacitor dielectric layer 41 is now formed over the cylindrical or shell-shaped polysilicon layer 40 as seen in FIG. 6. The layer is typically either composed of layers of silicon nitride and silicon oxide (NO) or layers of silicon oxide, silicon nitride and silicon oxide (ONO). In making the ONO dielectric, the first or bottom silicon oxide, O layer is formed by, for example exposure to deionized water (DI) to form a native silicon oxide having a thickness of about 50 Angstroms. The silicon nitride, N layer is formed by LPCVD wherein the gases are ammonia and $SiH_2Cl_2$, temperature of 760° C., pressure of 350 mTorr., to give a resulting thickness of between about 50 to 70 Angstroms. The top silicon oxide, O layer may be formed by exposing the N layer to dry oxygen at about 850° C. for about 30 minutes to form a silicon nitride/oxide layer.

Figure 8:
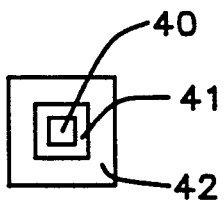

The top storage node electrode is formed by depositing third polysilicon layer 42 by in-situ deposition using silane. The thickness of this layer 42 is between about 1000 to 3000 Angstroms. The layer 42 is now patterned using conventional lithography and etching techniques to produce the FIG. 7 structure. The cross-section taken along 9:9 is shown in FIG. 8 to shown the structural nature of the cylindrical or shell-shaped structure.

Figure 9:
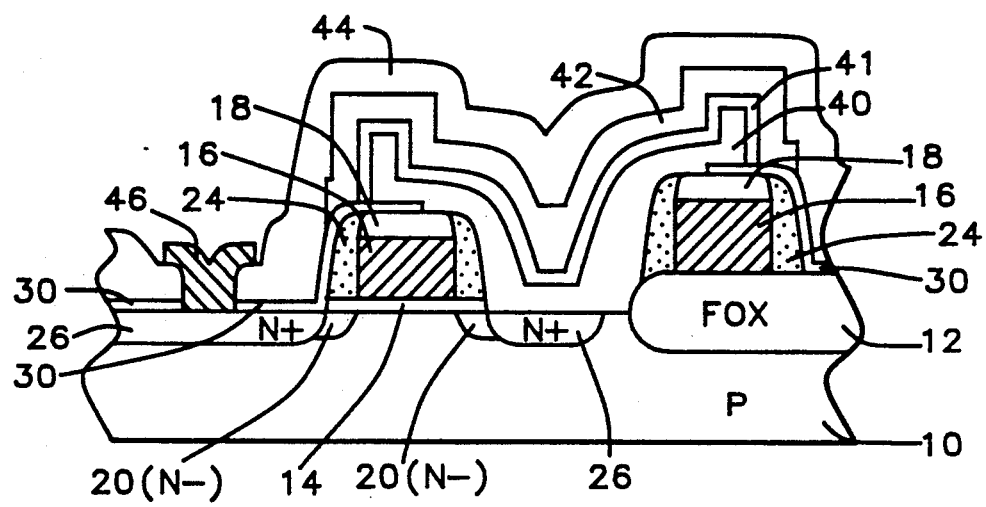

Referring now to FIG. 9, the final structure is shown with the next levels of electrical connections to the FET and stacked capacitor cell of the DRAM integrated circuit. An insulating layer 44 is deposited over the top surfaces of FIG. 8. It is a thick layer in the range of 3000 to 6000 Angstroms or more and can preferably be planarized by heat flow or by etching. The layer 44 can be for example a phosphosilicate glass, a borophosphosilicate glass, a silicon oxide—spin—on—glass—silicon oxide sandwich, or the like. Lithography and etching techniques are used to form the desired openings to a bit line contact. The desired contact metallurgy is deposited and patterned as is known in the art. Higher levels of metallurgy can in turn be formed over the metal level 46. For example, a higher level of metallurgy contact to top capacitor electrode (not shown) is necessary.

Referring now more particularly to FIGS. 10 through 17 there is shown a second embodiment of the method for fabricating a self-aligned, cylindrical stacked capacitor and field effect device structure. Many of the process steps and resulting structures, particularly in the early parts of the process are identical to that of the first embodiment and therefor we use the same numbers in this embodiment as used in the first embodiment where like structures exist. The method is identical to the first embodiment through the deposition of the second polysilicon layer 32 and therefor shall not be repeated herein.

Figure 10:
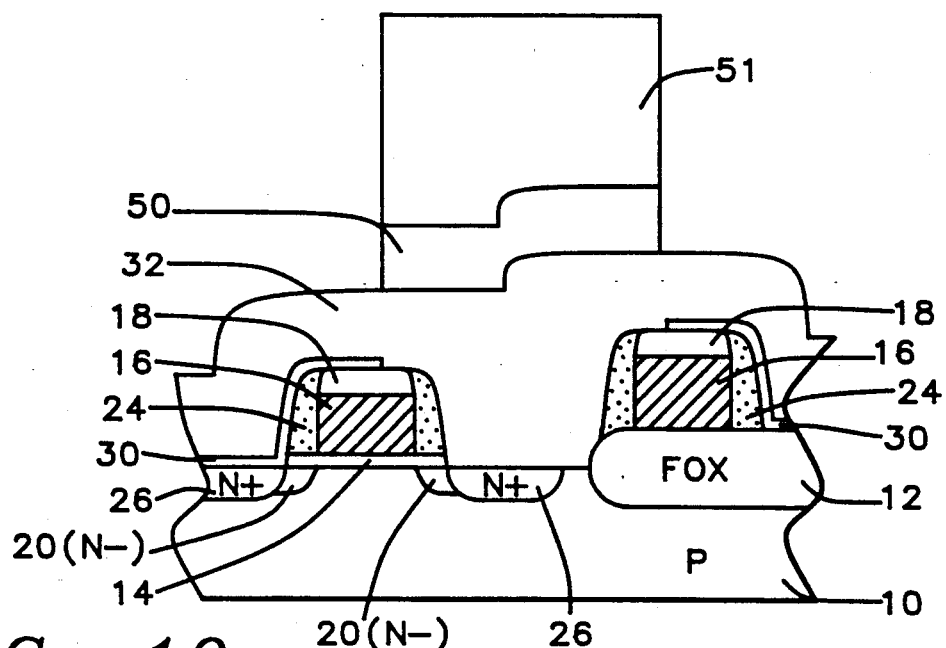
FIGS. 10 through 17 is a schematic cross-sectional representation of a second embodiment method for fabricating a stacked capacitor in combination with a field effect device which is usable in a DRAM cell.
Figure 11:
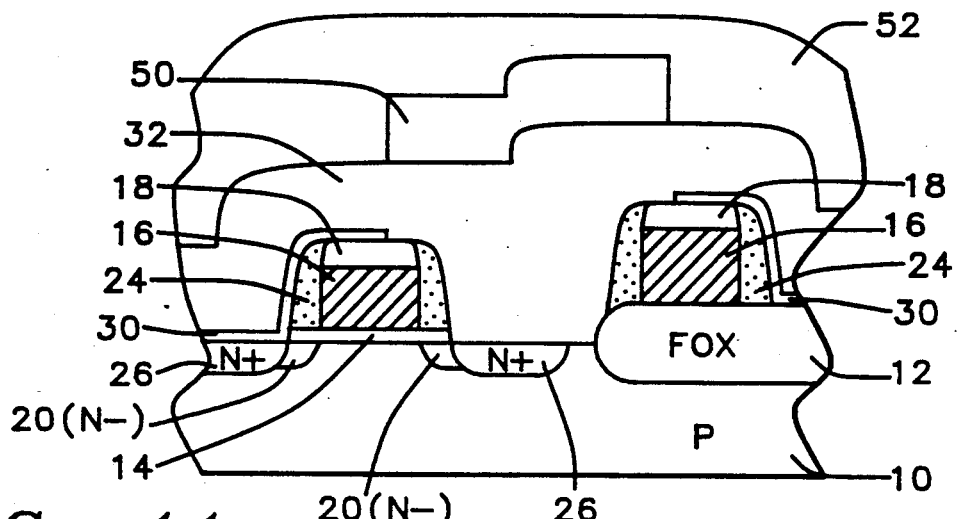

The second insulator layer 50 is composed of silicon nitride having a thickness of between about 2000 to 5000 Angstroms. This layer is formed by the LPCVD method as described above. The layered is patterned using conventional lithography and etching techniques which produces resist mask 51 to define the stacked capacitor structures as seen in FIG. 10.

Figure 12:
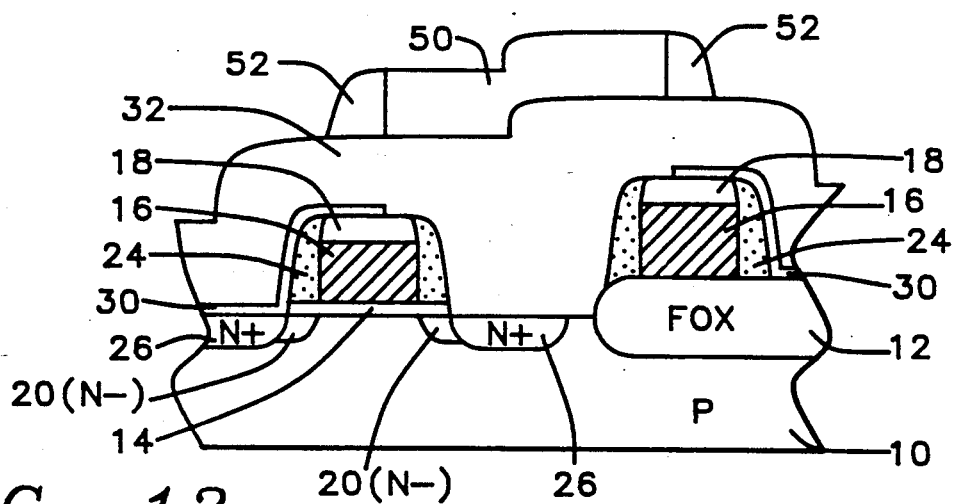
Figure 13:
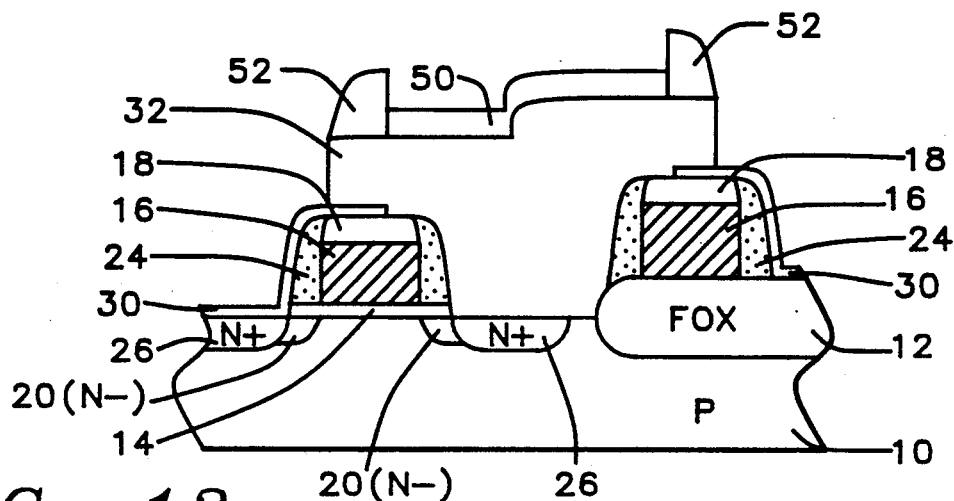

Sidewall spacer structures 52 are formed upon the sidewalls of the second insulating layer 50 by deposition of a silicon oxide layer 52 by LPCVD process as described above and as seen in FIG. 11. The thickness of this layer is critical, because its thickness translates to the width of the sidewall spacer 52. Anisotropic etching is used to substantially remove the horizontal components of the layer 52 and leaving the vertical components of the layer 52, that is the sidewall spacers 52 as seen in FIG. 12. This structure is now used as an etching mask for an anisotropic etching process to define the extent of the polysilicon layer 32 as seen in FIG. 13. Note that layer 50 will also partially be etched during this process resulting in the structure as shown in FIG. 13.

Figure 14:
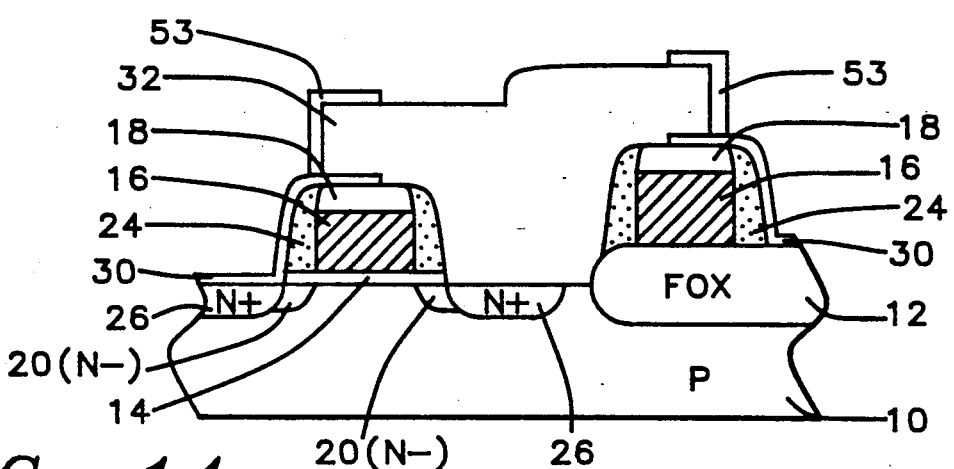
Figure 15:
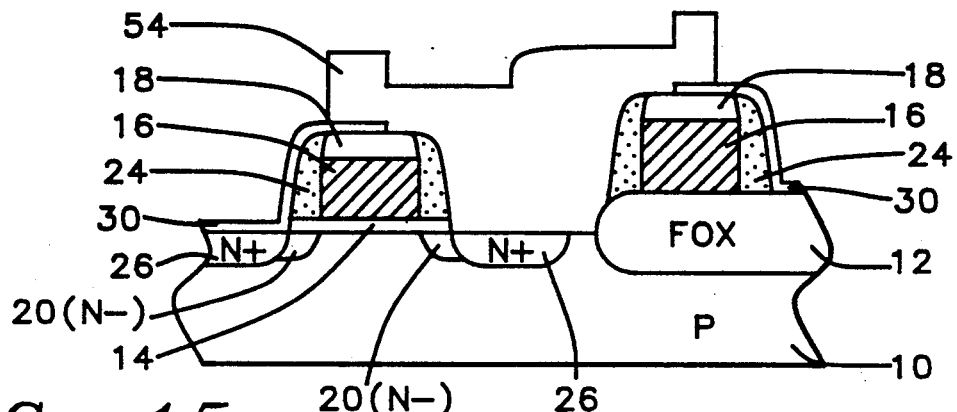

Referring now more particularly to FIG. 14, the sidewall spacers 52 are now removed using suitable etching composition, such as a dilute hydrofluoric acid solution. Using the second insulator layer 50, as a mask the exposed second polysilicon layer 32 is thermally oxidized in a wet oxygen atmosphere at about 900° C. to form layer silicon oxide 53. The second insulator layer 50 is now selectively and completely removed by suitable etching, such as hot phosphoric acid solution at a temperature between 160° to 180° C. to produce the structure of FIG. 14. Using the thermal silicon oxide layer 53 as a etch mask, the exposed second polysilicon layer 32 is anisotropically etched through a portion of its thickness as indicated at 54. The polysilicon etching process is the same as that described above. The etching process continues until between about 2000 to 4000 Angstroms have been removed and leaving between about 1000 to 2000 Angstroms remaining. The cylindrical or shell-shaped lower electrode is now completed. The silicon oxide layer 53 is removed using a conventional silicon oxide etchant which results in the FIG. 15 structure.

Figure 16:
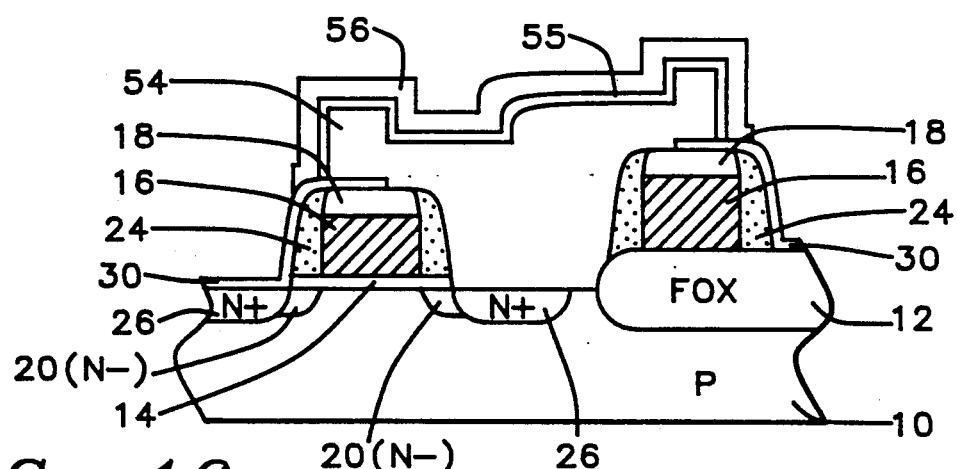

The capacitor dielectric layer 55 is now formed over the cylindrical or shell-shaped polysilicon layer 54 as seen in FIG. 16. The layer is typically either composed of layers of silicon nitride and silicon oxide (NO) or layers of silicon oxide, silicon nitride and silicon oxide (ONO). These layers are formed as described in the first embodiment.

The top storage node electrode is formed by depositing third polysilicon layer 56 as described in the first embodiment to result in the thickness of this layer 56 between about 1000 to 3000 Angstroms. The layer 56 is now patterned using conventional lithography and etching techniques to produce the FIG. 16 structure.

Figure 17:
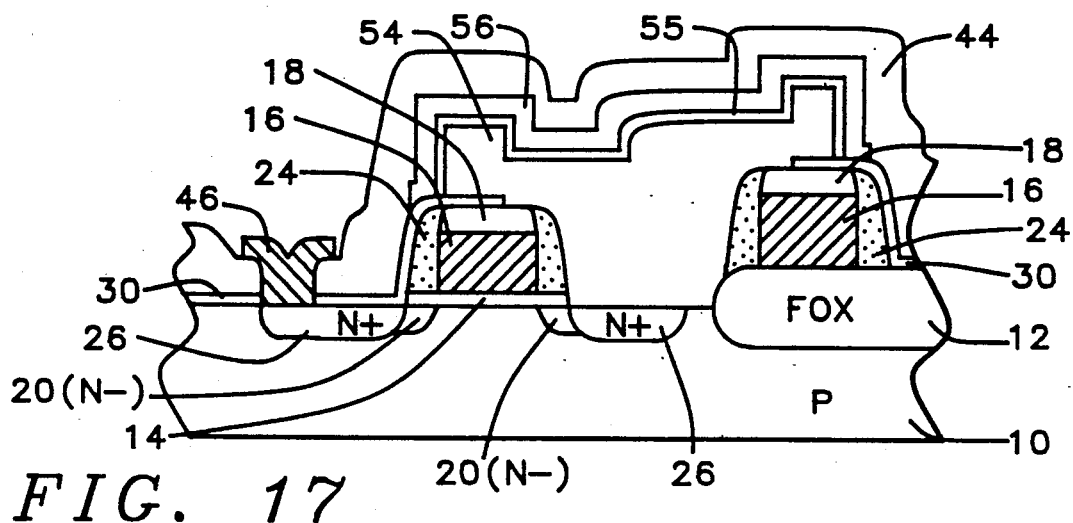

Referring now to FIG. 17, the final structure is shown with the next levels of electrical connections to the FET and stacked capacitor cell of the DRAM integrated circuit. The insulating layer 44 and contact metal level 46 are given like numbers as is given in FIG. 9, since they have similar structures, characteristics, thicknesses and compositions.

Referring now more particularly to FIGS. 18 through 24 there is shown a third embodiment of the method for fabricating a self-aligned, cylindrical stacked capacitor and field effect device structure. Many of the process steps and resulting structures, particularly in the early parts of the process are identical to that of the first embodiment and therefor we use the same numbers in this embodiment as used in the first embodiment where like structures exist. The method is identical to the first embodiment through the deposition of the second polysilicon layer 32 and therefor shall not be repeated herein.

Figure 18:
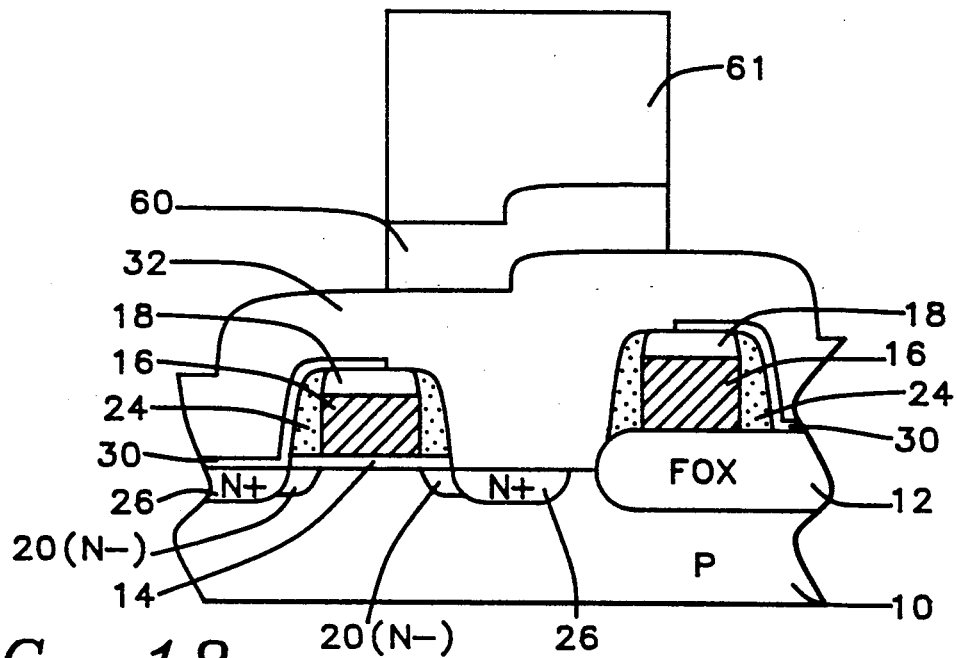
FIGS. 18 through 23 is a schematic cross-sectional representation of a third embodiment method for fabricating a stacked capacitor in combination with a field effect device which is usable in a DRAM cell.

The second insulator layer 60 is composed of silicon nitride having a thickness of between about 2000 to 5000 Angstroms. This layer is formed by the LPCVD method described above. The layered is patterned using conventional lithography and etching techniques which produces resist mask 61 to define the stacked capacitor structures as seen in FIG. 18.

Figure 19:
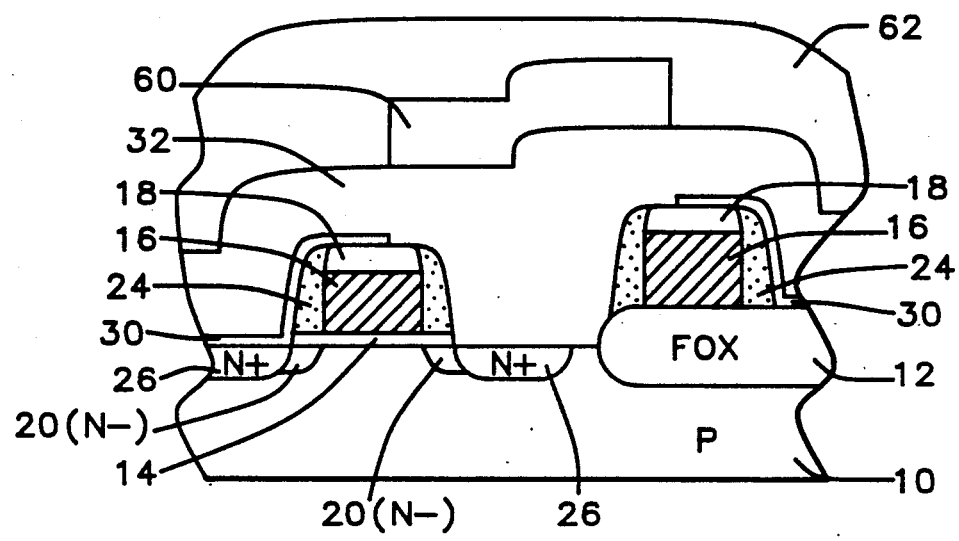
Figure 20:
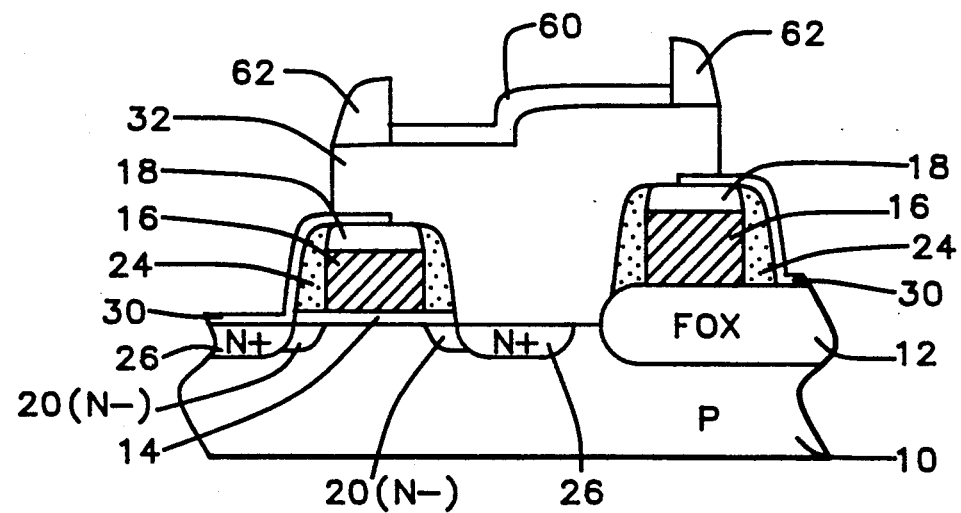
Figure 21:
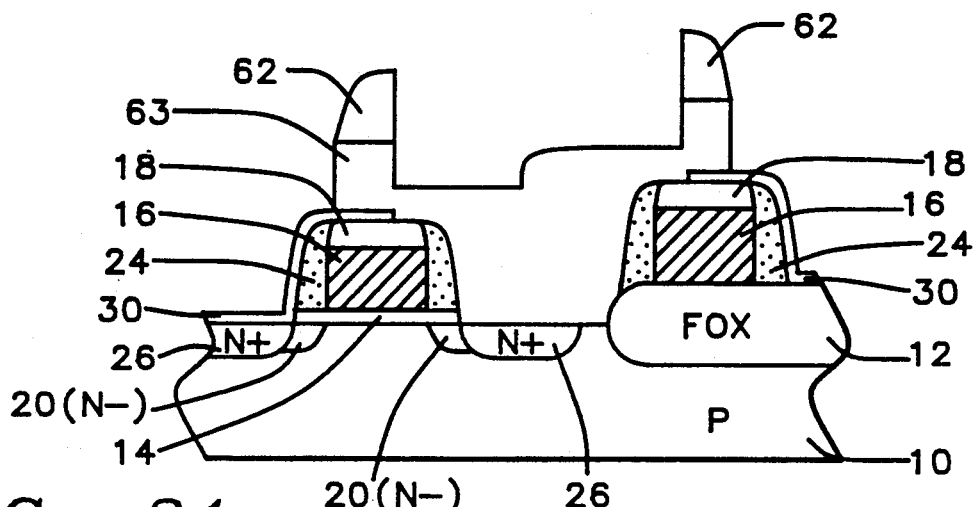
Figure 22:
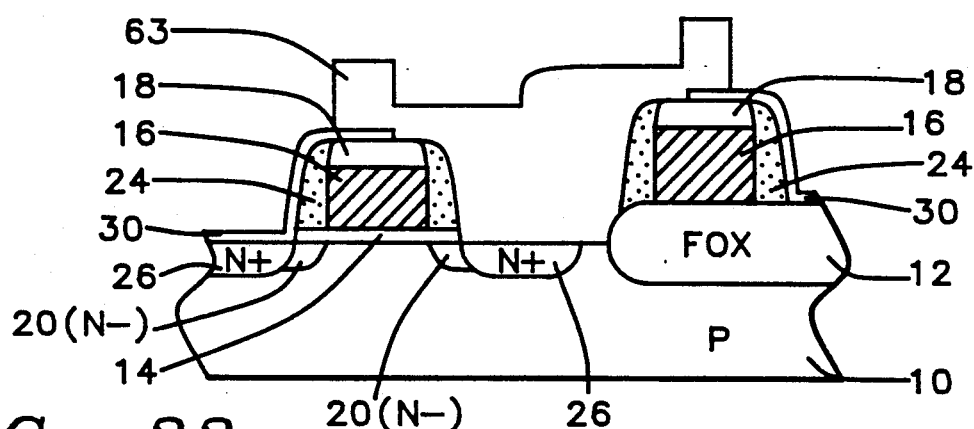

Sidewall spacer structures 62 are formed upon the sidewalls of the second insulating layer 60 by deposition of a silicon oxide layer 62 as described in the second embodiment and as seen in FIG. 19. The thickness of this layer is critical, because its thickness translates to the width of the sidewall spacer 62 which in turn translates into the with of the cylindrical shell-shaped stacked capacitor. Anisotropic etching is used to substantially remove the horizontal components of the layer 62 and leaving the vertical components of the layer 62, that is the sidewall spacers 62 as seen in FIG. 20. This structure is now used as an etching mask for an anisotropic etching process to remove the non-capacitor area of the polysilicon layer 32. During this etching step a portion of layer 60 also is removed as seen in FIG. 20. The remaining portion of layer 60 is now removed using phosphoric acid solution. Lithography and anisotropic etching is used through a portion of its thickness to define the polysilicon layer 32 into a lower electrode 63 of the stacked capacitor as seen in FIG. 21. The polysilicon etching process and conditions are the same as described above.

After the formation of the spacer 62 in FIG. 19, we use spacer 62 and now silicon nitride only layer 60 as etch mask and etch anisotropically the non-capacitor area of the polysilicon layer 32. During this anisotropic etching process, a portion of layer 60 is also removed. The final structure is shown in FIG. 20. The remaining portion of layer 60 is removed with phosphoric acid solution. The spacer 62 is used as an etch mask and a portion of the polysilicon layer 32 is anisotropically etched to result in FIG. 21. The etching process continues until between about 2000 to 4000 Angstroms have been removed and leaving between about 1000 to 1500 Angstroms remaining in the capacitor areas. The cylindrical or shell-shaped lower electrode 63 is now completed. The silicon oxide spacers 62 are removed using a conventional silicon oxide etchant which results in the FIG. 22 structure.

Figure 23:
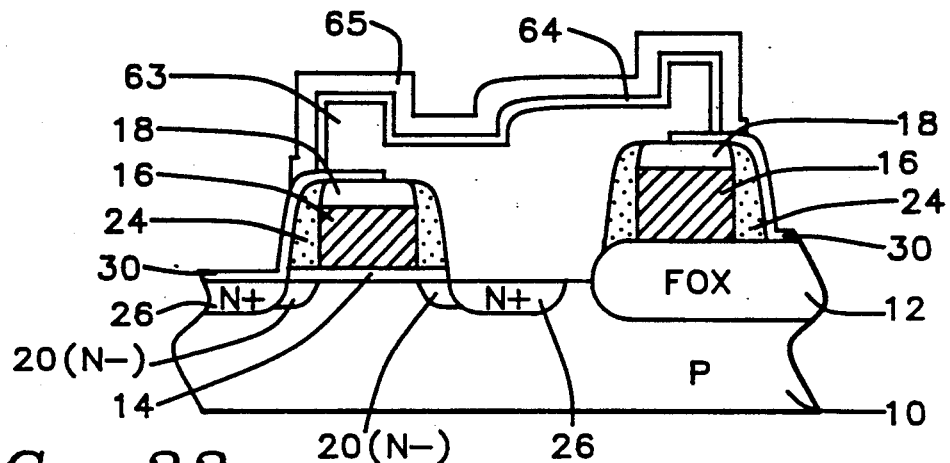

The capacitor dielectric layer 64 is now formed over the cylindrical or shell-shaped polysilicon layer 63 as seen in FIG. 23. The layer is typically either composed of layers of silicon nitride and silicon oxide (NO) or layers of silicon oxide, silicon nitride and silicon oxide (ONO). These layers are formed as described in the first embodiment.

The top storage node electrode is formed by depositing third polysilicon layer 65 as described in the first embodiment to result in the thickness of this layer 65 between about 1000 to 3000 Angstroms. The layer 65 is now patterned using conventional lithography and etching techniques to produce the FIG. 23 structure.

The final structure of the third embodiment with regard to the next levels of electrical connections to the FET and stacked capacitor cell of the DRAM integrated circuit is similar to that of the second embodiment and will not be shown in detail here.

Referring now more particularly to FIGS. 24 through 33 there is shown a fourth embodiment of the method for fabricating a self-aligned, cylindrical stacked capacitor and field effect device structure. Many of the process steps and resulting structures, particularly in the early parts of the process are identical to that of the first embodiment and therefor we use the same numbers in this embodiment as used in the first embodiment where like structures exist. The method is identical to the first embodiment through the deposition of the second polysilicon layer 32 except for the patterning of first insulator layer 30 and therefor shall not be repeated herein.

The first insulator layer 30 is not patterned before the deposition of the second polysilicon layer 32. It is patterned later in the process as is described below.

Figure 24:
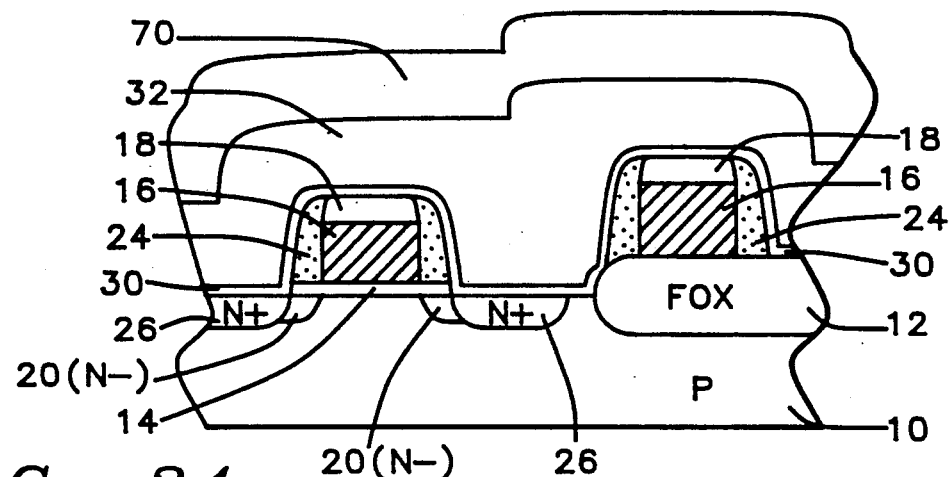
FIGS. 24 through 33 is a schematic cross-sectional representation of a fourth embodiment method for fabricating a stacked capacitor in combination with a field effect device which is usable in a DRAM cell.
Figure 25:
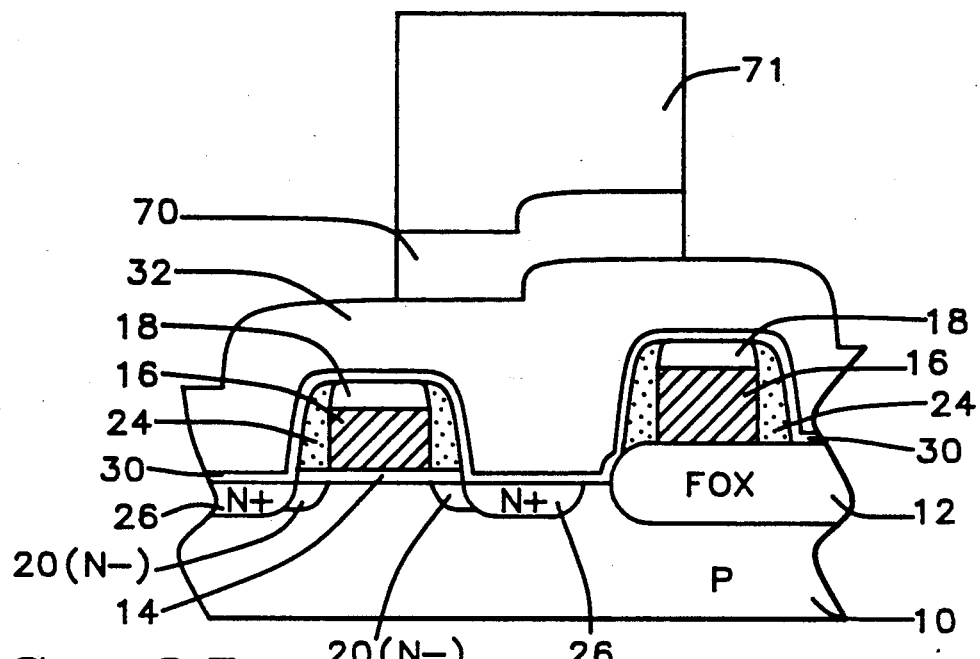

Referring now more particularly to FIGS. 24 and 25, the second insulator layer 70 is composed of silicon nitride having a thickness of between about 2000 to 5000 Angstroms. This layer is formed by the LPCVD method described above. The layered is patterned using conventional lithography and etching techniques which produces resist mask 71 to define the stacked capacitor structures as seen in FIG. 25.

Figure 26:
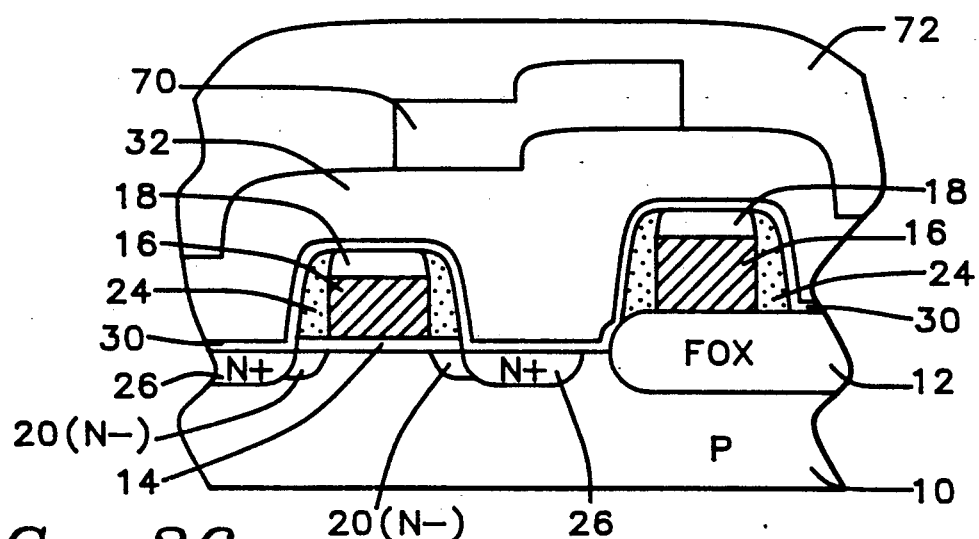
Figure 27:
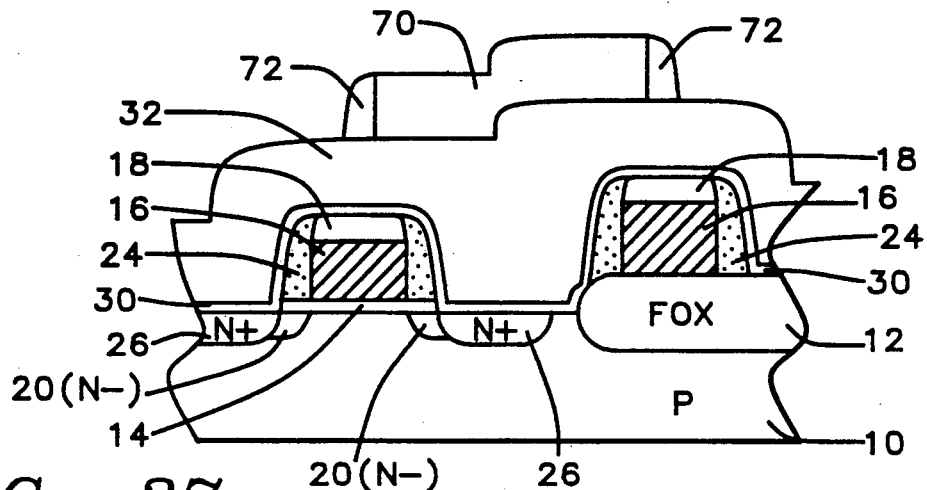

Sidewall spacer structures 72 are formed upon the sidewalls of the second insulating layer 70 by deposition of a silicon oxide layer 72 by the LPCVD process as seen in FIGS. 26 and 27. The thickness of this layer is critical, because its thickness translates to the width of the sidewall spacer 72. Anisotropic etching is used to substantially remove the horizontal components of the layer 72 and leaving the vertical components of the layer 72, that is the sidewall spacers 72 as seen in FIG.

Figure 28:
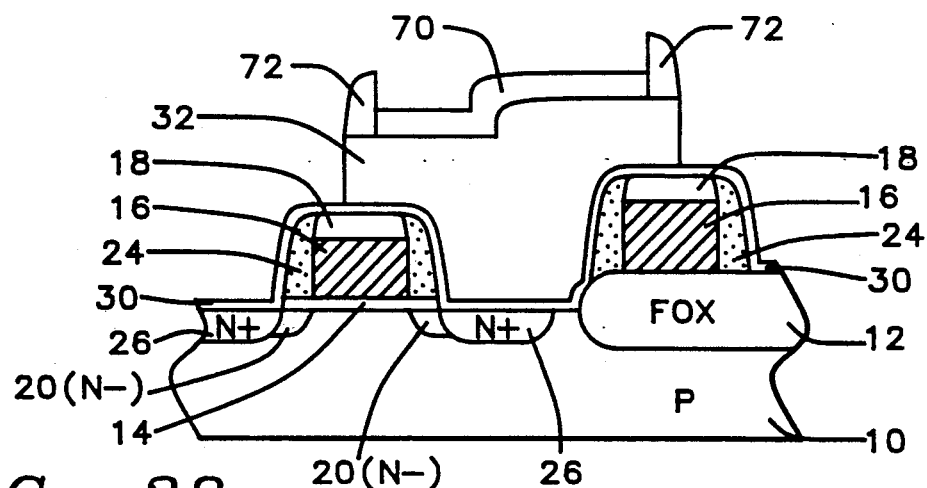

27. This structure is now used as an etching mask for an anisotropic etching process to define the extent of the polysilicon layer 32 as seen in FIG. 28. During the etching of layer 32, a portion of layer 70 is also removed as seen in FIG. 28. The second insulator layer 70 is now completely removed by etching as described in previous embodiments.

Figure 29:
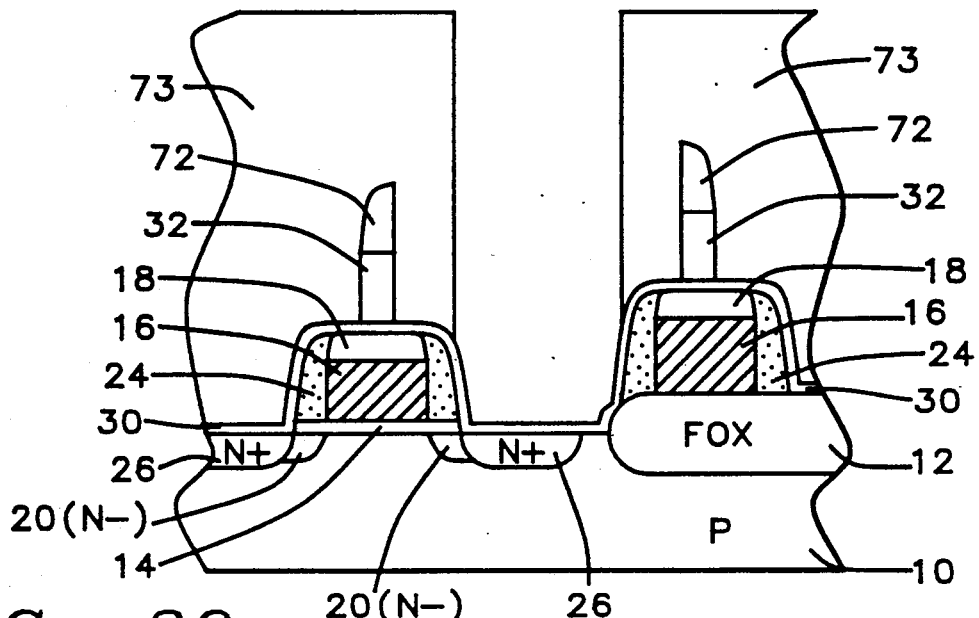
Figure 30:
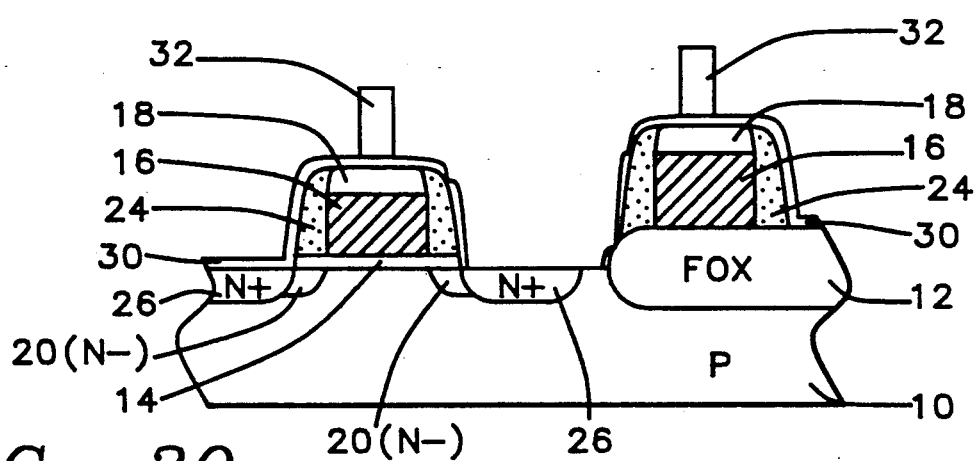

Referring now more particularly to FIGS. 29 and 30, the sidewall spacers 52 are now used as an etch mask to form the cylindrical or shell-shaped portion of the stacked capacitor of the present invention. Anisotropic etching of the second polysilicon layer 32 results in the FIG. 29 structure. A resist mask 73 is formed by lithography and etching techniques to allow for the patterning of the first insulator layer 30 to make openings in this layer 30 for the self-aligned electrical contact to the needed source/drain structures of the device areas. Suitable etching will remove the exposed layer 30 in FIG. 29. The resist layer 73 is now removed. The sidewall spacers 72 are also removed to complete FIG. 30.

The lower capacitor electrode is completed by the deposition of a contact polysilicon layer 74 over the device and field oxide areas and patterning by conventional lithography and etching techniques. The contact polysilicon layer 74 also makes electrical contact with the needed source/drain structures of the device areas. This polysilicon layer is deposited by LPCVD in-situ phosphorus-doped as described above and has a thickness of between about 300 to 1000 Angstroms. The polysilicon layer 74 is now patterned to remove noncapacitor portions of the layer 74 by conventional lithography and etching to form the lower capacitor electrode pattern.

Figure 31:
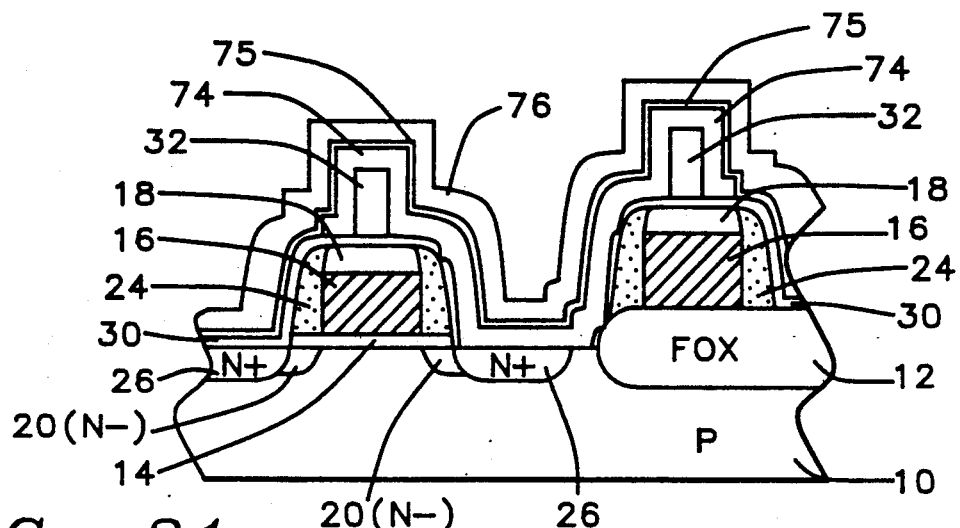
Figure 32:
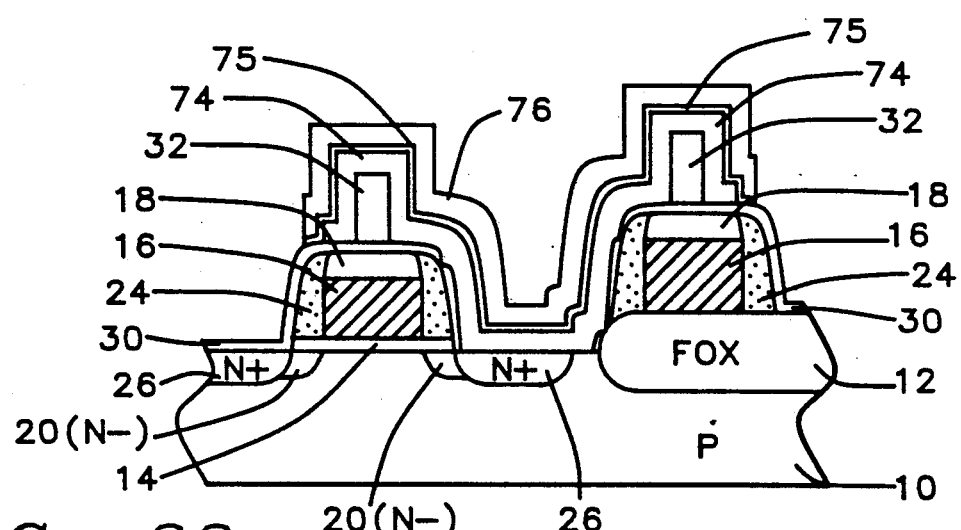

The capacitor dielectric layer 75 is now formed over the cylindrical or shell-shaped polysilicon layer 32, 74 as seen in FIG. 31. The layer is typically either composed of layers of silicon nitride and silicon oxide (NO) or layers of silicon oxide, silicon nitride and silicon oxide (ONO). These layers are formed as described in the first embodiment.

The top storage node electrode is formed by depositing third polysilicon layer 76 as described in the first embodiment to result in the thickness of this layer 76 between about 1000 to 3000 Angstroms.

The layers 75 and 76 are now patterned by lithography and etching techniques to complete the top capacitor electrode being composed of third polysilicon layer 76.

Figure 33:
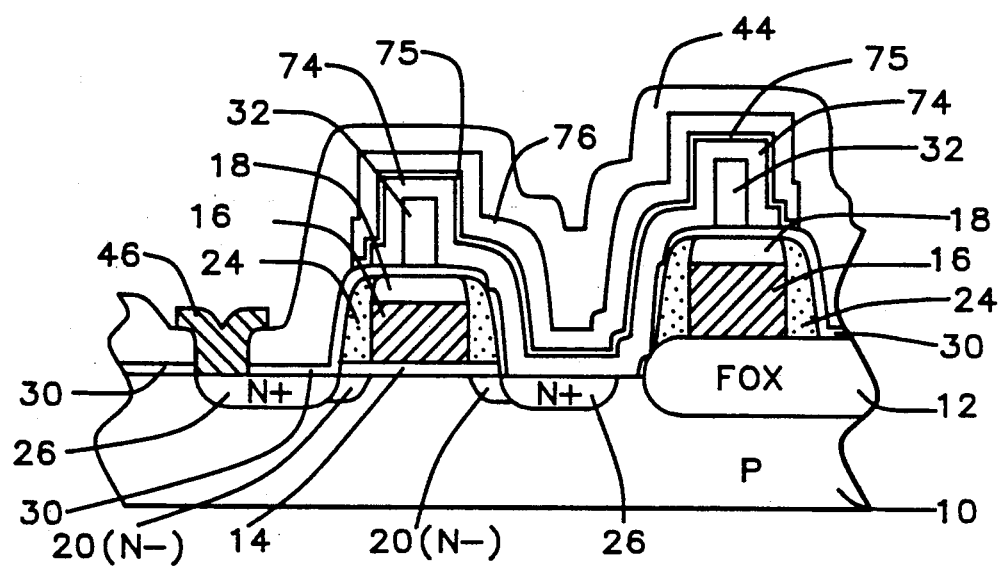

Referring now to FIG. 33, the final structure is shown with the next levels of electrical connections to the FET and stacked capacitor cell of the DRAM integrated circuit. The insulating layer 44 and contact metal level 46 are given like numbers as is given in FIG. 9, since they have similar structures, characteristics, thicknesses and compositions.

While the invention has been particularly shown and described with reference to the preferred embodiments thereof. It will be understood by those skilled in the art that various changes in form and details may be made without departing from the spirit and scope of the invention.

What is claimed is:

1. A method for fabricating a dynamic random access memory having a high capacitance stacked capacitor comprising:

selectively forming relatively thick field oxide areas on the surface of a semiconductor substrate while leaving device areas for fabrication of field effect devices;

forming a gate dielectric layer on said substrate in the said device areas;

depositing a relatively thick first layer of polysilicon on the said field oxide areas and said device areas;

removing portions of said first polysilicon layer while leaving portions thereof for the gate structure in said device areas, and portions over said field oxide areas;

forming source/drain structures within said device areas of said semiconductor substrate associated with said gate structures;

forming a first insulator layer composed at least in part of silicon nitride over said device and field oxide areas and patterning the layer to leave source/drain structures open in the said device areas where electrical contact is desired to said stacked capacitors; and forming said stacked capacitors by, depositing a second polysilicon layer over the device and field oxide areas, depositing a second insulator layer composed at least in part of silicon nitride over said second polysilicon layer and patterning said second insulator layer and said second polysilicon layer anisotropically with an etch mask to define the stacked capacitor areas, controlably etching said etch mask to laterally remove a certain portion of the mask and to thereby expose said second insulator layer, etching the exposed said second insulator layer and removing said etch mask, thermally oxidizing exposed said second polysilicon layer and removing the said second insulating layer, anisotropically etching said exposed second polysilicon layer through a portion of its thickness and remove said thermally oxidized layer of polysilicon, forming a capacitor dielectric layer over the said second polysilicon layer, and depositing and patterning a third polysilicon layer as the top storage node electrode to complete said stacked capacitors.

2. The method of claim 1 wherein the thickness of said first polysilicon layer is between about 1500 to 4000 angstroms.

3. The method of claim 1 wherein the composition of said first insulator layer is a layer of silicon oxide and silicon nitride wherein the total thickness is between about 900 to 2000 angstroms.

4. The method of claim 1 wherein the thickness of said second polysilicon layer is between about 3000 to 6000 angstroms.

5. The method of claim 1 wherein the composition of said second insulator layer is a layer of silicon oxide and silicon nitride wherein the total thickness is between about 200 to 800 angstroms.

6. The method of claim 1 wherein said etch mask is composed of resist and said controlably etching is by oxygen plasma to laterally remove about 1000 to 4000 angstroms of said etch mask which translates into the thickness of the stacked capacitor shell.

7. The method of claim 1 wherein the etching of said exposed thickness of the said second polysilicon layer continues until between about 2000 to 4000 angstroms are removed.

8. The method of claim 1 wherein said capacitor dielectric is composed if layers of silicon oxide, silicon nitride and silicon oxide.

9. A method for fabricating a dynamic random access memory having a high capacitance stacked capacitor comprising:

selectively forming relatively thick field oxide areas on the surface of a semiconductor substrate while leaving device areas for fabrication of field effect devices; forming a gate dielectric layer on said substrate in the said device areas;

depositing a relatively thick first layer of polysilicon on the said field oxide areas and said device areas;

removing portions of said first polysilicon layer while leaving portions thereof for the gate structure in said device areas, and portions over said field oxide areas; forming source/drain structures within said device areas of said semiconductor substrate associated with said gate structures;

forming a first insulator layer composed at least in part of silicon nitride over said device and field oxide areas and patterning the layer source/drain structures open in the said device areas where electrical contact is desired to said stacked capacitors; and forming said stacked capacitors by, depositing a second polysilicon layer over the device and field oxide areas, depositing a second insulator layer composed at least in part of silicon nitride over said second polysilicon layer and patterning said second insulator layer to define the stacked capacitor areas, forming sidewall spacer structure on the edges of said second insulator layer, anisotropically etch said second polysilicon layer;

removing said spacer structures by etching, thermally oxidizing the exposed second polysilicon layer and then removing said second insulator layer, anisotropically etching said exposed second polysilicon layer through a portion of its thickness and remove said thermally oxidized layer of polysilicon, forming a capacitor dielectric layer over the said second polysilicon layer, and depositing and patterning a third polysilicon layer as the top storage node electrode to complete said stacked capacitors.

10. The method of claim 9 wherein the thickness of said first polysilicon layer is between about 1500 to 4000 angstroms.

11. The method of claim 9 wherein the composition of said first insulator layer is a layer of silicon oxide and silicon nitride wherein the total thickness is between about 900 to 2000 angstroms.

12. The method if claim 9 wherein the thickness of said second polysilicon layer is between about 3000 to 6000 angstroms.

13. The method of claim 9 wherein the composition of said second insulator layer is a layer of silicon oxide and silicon nitride wherein the total thickness is between about 2000 to 5000 angstroms.

14. The method of claim 9 wherein said sidewall spacer structures are composed of silicon oxide and have a lateral thickness between about 1000 to 4000 angstroms which translates into the thickness of said stacked capacitor shell.

15. The method of claim 9 wherein the etching of said exposed thickness of the said second polysilicon layer continues until between about 2000 to 4000 angstroms are removed.

16. The method of claim 9 wherein said capacitor dielectric is composed of layers of silicone oxide, silicon nitride and silicon oxide.

17. The method for fabricating a dynamic random access memory having a high capacitance stacked capacitor comprising:

selectively forming relatively thick field oxide areas on the surface of a semiconductor substrate while leaving device areas for fabrication of field effect devices; forming a gate dielectric layer on said substrate in the said device areas;

depositing a relatively thick first layer of polysilicon on the said field oxide areas and said device areas; removing portions of said first polysilicon layer while leaving portions thereof for the gate structure in said device areas, and portions over said field oxide areas;

forming a source/drain structures within said device areas of said semiconductor substrate associated with said gate structures;

forming a first insulator layer composed at least in part of silicon nitride over said device and field oxide areas; and forming said stacked capacitors by, depositing a second polysilicon layer over the device and field oxide areas, depositing a second insulator layer composed at least in part of silicon nitride over said second polysilicon layer and patterning said second insulator layer to define the stacked capacitor areas, forming sidewall spacer structures on the edges of said second insulator layer, anisotropically etching the exposed said second polysilicon layer, removing said second insulator layer, anisotropically etch the exposed said second polysilicon layer, forming opening to said desired source/drain structures through said first insulator using lithography techniques, removing said spacer structures by etching, depositing a contact polysilicon layer over said field oxide and device areas over the stacked capacitor areas and patterning said contact polysilicon layer to complete with said second polysilicon the lower electrode of said stacked capacitor and the contact to said source/drain structures, forming a capacitor dielectric layer over the said second polysilicon layer, depositing a contact polysilicon layer as the top storage node electrode, and patterning said dielectric layer and said third polysilicon layer to complete said stacked capacitors.

18. The method of claim 17 wherein the thickness of said first polysilicon layer is between about 1500 to 4000 angstroms.

19. The method of claim 17 wherein the composition of said first insulator layer is a layer of silicon oxide and silicon nitride wherein the total thickness is between about 900 to 2000 angstroms.

20. The method of claim 17 wherein the thickness of said second polysilicon layer is between about 3000 to 5000 angstroms.

21. The method of claim 17 wherein the composition of said second insulator layer is a layer of silicon oxide and silicon nitride wherein the total thickness is between about 2000 to 5000 angstroms.

22. The method of claim 17 wherein said sidewall spacer structures are composed of silicon oxide and have a lateral thickness between about 1000 to 4000 angstroms which translates into the thickness of said stacked capacitor shell.

23. The method of claim 17 wherein the etching of said exposed thickness of the said second polysilicon layer continues until between about 2000 to 4000 angstroms are removed.

* * * * *